United States Patent
Oh

(10) Patent No.: US 9,275,711 B2
(45) Date of Patent: Mar. 1, 2016

(54) COMMAND PROCESSING CIRCUIT, MEMORY DEVICE AND MEMORY SYSTEM INCLUDING THE SAME

(71) Applicant: SAMSUNG ELECTRONICS CO., LTD., Suwon-si, Gyeonggi-do (KR)

(72) Inventor: Tae-Young Oh, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/559,623

(22) Filed: Dec. 3, 2014

(65) Prior Publication Data

US 2015/0187404 A1    Jul. 2, 2015

(30) Foreign Application Priority Data

Dec. 30, 2013 (KR) .......................... 10-2013-0166352

(51) Int. Cl.

| G11C 7/22 | (2006.01) |
|---|---|
| G11C 8/18 | (2006.01) |
| G11C 8/10 | (2006.01) |
| G11C 11/4096 | (2006.01) |
| G11C 11/4076 | (2006.01) |

(52) U.S. Cl.
CPC ........ *G11C 8/18* (2013.01); *G11C 7/222* (2013.01); *G11C 8/10* (2013.01); *G11C 11/4076* (2013.01); *G11C 11/4096* (2013.01)

(58) Field of Classification Search
CPC ........................................... G11C 7/222
USPC .......................................... 365/191
See application file for complete search history.

(56) References Cited

U.S. PATENT DOCUMENTS

| 6,496,445 | B2 | 12/2002 | Lee | |
|---|---|---|---|---|
| 8,055,930 | B2 | 11/2011 | Bae et al. | |
| 8,253,449 | B2 | 8/2012 | Seki et al. | |
| 8,254,201 | B2 | 8/2012 | Sohn et al. | |
| 2012/0119809 | A1* | 5/2012 | Ku ........................ | G11C 7/222 327/299 |
| 2012/0268170 | A1 | 10/2012 | Kondo | |
| 2013/0182516 | A1 | 7/2013 | Kinoshita | |

FOREIGN PATENT DOCUMENTS

| JP | 2003216268 A | 7/2003 |
|---|---|---|
| JP | 3534096 B | 3/2004 |
| JP | 2004206480 A | 7/2004 |
| JP | 2009200661 A | 9/2009 |
| JP | 2013115529 A | 6/2013 |
| KR | 1020090053394 A | 5/2009 |

* cited by examiner

*Primary Examiner* — Son Mai
(74) *Attorney, Agent, or Firm* — Volentine & Whitt, PLLC

(57) ABSTRACT

A command processing circuit of a memory device includes a clock divider, a clock controller and a command decoder. The clock divider generates a plurality of divided clock signals based on an external clock signal having a first frequency. The divided clock signals have a second frequency lower than the first frequency. Each of the divided clock signals has a phase that is different from phases of the other divided clock signals. The clock controller generates an operating clock signal based on a command signal and the divided clock signals, where the command signal is transferred in synchronization with the external clock signal. The operating clock signal has the second frequency and a phase corresponding to reception timing of the command signal. The command decoder decodes the command signal in synchronization with the operating clock signal.

20 Claims, 18 Drawing Sheets

| OPERATION | SYMBOL | /CS | /RAS | /CAS | /WE | ADDRESS |
|---|---|---|---|---|---|---|
| ACTIVE | ACT | L | L | H | H | BA , RA |
| READ | RD | L | H | L | H | CA |
| WRITE | WR | L | H | L | L | CA |

COMMAND PROCESSING CIRCUIT, MEMORY DEVICE AND MEMORY SYSTEM INCLUDING THE SAME

CROSS-REFERENCE TO RELATED APPLICATION

A claim of priority under 35 USC §119 is made to Korean Patent Application No. 10-2013-0166352 filed on Dec. 30, 2013, in the Korean Intellectual Property Office (KIPO), the disclosure of which is incorporated by reference in its entirety herein.

BACKGROUND

Example embodiments relate generally to semiconductor integrated circuits, and more particularly to a command processing circuit, a memory device and a memory system including the command processing circuit.

A memory device is generally equipped to receive a command signal from a host device such as a memory controller. Standards associated with the memory device define a clock timing according to which the memory device receives the command signal. That is, the memory device is configured to receive the command signal at each clock in order to decode and process the command signal within a clock cycle.

As techniques for manufacturing memory devices evolve to allow for higher operating speeds, it has become increasingly difficult to process the command signal within each clock cycle. In an effort to overcome this problem, a plurality of processing units may be included in the memory device to allow for processing of the command signal using a time-interleaved scheme. However, time-interleaved processing using multiple command processing units suffers the drawback of increased power consumption.

SUMMARY

According to example embodiments, a command processing circuit of a memory device includes a clock divider, a clock controller and a command decoder. The clock divider generates a plurality of divided clock signals based on an external clock signal having a first frequency. The divided clock signals have a second frequency lower than the first frequency. Each of the divided clock signals has a phase that is different from phases of the other divided clock signals. The clock controller generates an operating clock signal based on a command signal and the divided clock signals, where the command signal is transferred in synchronization with the external clock signal. The operating clock signal has the second frequency and a phase corresponding to reception timing of the command signal. The command decoder decodes the command signal in synchronization with the operating clock signal.

The clock controller may activate one divided clock signal having the phase corresponding to the reception timing of the command signal among the divided clock signals to provide the one divided clock signal as the operating clock signal.

The clock controller may detect the reception timing of the command signal based on a chip selection signal.

The clock controller may include a timing controller and a clock output circuit. The timing detector may generate a plurality of clock enable signals by comparing the phases of the divided clock signals with a phase of the command signal, and may activate one clock enable signal corresponding to the reception timing of the command signal among the clock enable signals. The clock output circuit may provide the operating clock signal based on the divided clock signals and the clock enable signals.

The clock output circuit may include a plurality of clock buffers configured to buffer the divided clock signals to output a plurality of internal clock signals having the second frequency. Each of the plurality of internal clock signals has a phase that is different from phases of the other internal clock signals.

One internal clock signal among the internal clock signals, which is output from the clock buffer receiving the one activated clock enable signal, may be activated. The one internal clock signal may be provided as the operating clock signal. The other internal clock signals except the one internal clock signal may be deactivated.

The command decoder may include a plurality of decoding units coupled to outputs of the clock buffers to receive the internal clock signals, respectively.

One decoding unit among the decoding units, which receives the operating clock signal, may be enabled to decode the command signal. The other decoding units except the one decoding unit may be disabled.

The clock output circuit may include a phase splitter configured to receive one divided clock signal among the divided clock signals and may adjust a phase of the one divided clock signal to output a plurality of internal clock signals having the second frequency. Each of the plurality of internal clock signals has a phase that is different from phases of the other internal clock signals.

One internal clock signal among the internal clock signals, which corresponds to the one activated clock enable signal, may be activated. The one internal clock signal may be provided as the operating clock signal. The other internal clock signals except the one internal clock signal may be deactivated.

The command decoder may include a plurality of decoding units coupled to outputs of the phase splitter to receive the internal clock signals, respectively.

One decoding unit among the decoding units, which receives the operating clock signal, may be enabled to decode the command signal. The other decoding units except the one decoding unit may be disabled.

The phase splitter may be disposed closer to the command decoder than to the clock divider.

The clock output circuit may include a multiplexer configured to select one divided clock signal among the divided clock signals in response to the clock enable signals to provide the one divided clock signal as the operating clock signal.

The command decoder may include a single decoding unit coupled to an output of the multiplexer to receive the operating clock signal and decode the command signal.

The timing detector may include a first flip-flop configured to latch a chip selection signal in response to a first divided clock signal among the divided clock signals, a second flip-flop configured to latch the chip selection signal in response to a second divided clock signal among the divided clock signals, a first AND logic gate configured to perform AND logic operation on an inversion output of the first flip-flop, the chip selection signal and the second divided clock signal, a second AND logic gate configured to perform AND logic operation on an inversion output of the second flip-flop, the chip selection signal and the first divided clock signal, a first OR logic gate configured to perform OR logic operation on an output of the first flip-flop, an output of the first AND logic gate and a first latency alignment signal to output a first clock enable signal among the clock enable signals, and a second OR logic gate configured to perform OR logic operation on an output of the second flip-flop, an output of the second AND logic gate and a second latency alignment signal to output a second clock enable signal among the clock enable signals.

The timing detector may deactivate the first clock enable signal in response to the first latency alignment signal and deactivate the second clock enable signal in response to the second latency alignment signal.

The command decoder may generate the first latency alignment signal and the second latency alignment signal based on values stored in a mode register set.

According to example embodiments, a memory device includes a memory core configured to operate in response to a control signal, a command processing circuit configured to decode a command signal from an external device, and a control circuit configured to generate the control signal based on an output of the command processing circuit. The command processing circuit includes a clock divider configured to generate a plurality of divided clock signals based on an external clock signal having a first frequency, the divided clock signals having a second frequency lower than the first frequency, a clock controller configured to generate an operating clock signal based on the command signal and the divided clock signals, and a command decoder configured to decode the command signal in synchronization with the operating clock signal. Each of the divided clock signals has a phase that is different from phases of the other divided clock signals. The command signal is transferred in synchronization with the external clock signal. The operating clock signal has the second frequency and a phase corresponding to reception timing of the command signal.

According to example embodiments, a memory system includes a memory controller configured to transfer a command signal in response to a system clock signal, a memory core configured to operate in response to a control signal, a command processing circuit configured to decode the command signal from the memory controller, and a control circuit configured to generate the control signal based on an output of the command processing circuit. The command processing circuit includes a clock divider configured to generate a plurality of divided clock signals based on the system clock signal having a first frequency, the divided clock signals having a second frequency lower than the first frequency, a clock controller configured to generate an operating clock signal based on the command signal and the divided clock signals, and a command decoder configured to decode the command signal in synchronization with the operating clock signal. Each of the divided clock signals has a phase that is different from phases of the other divided clock signals. The operating clock signal has the second frequency and a phase corresponding to reception timing of the command signal.

BRIEF DESCRIPTION OF THE DRAWINGS

Example embodiments of the inventive concept will be more clearly understood from the detailed description that follows taken in conjunction with the accompanying drawings.

DETAILED DESCRIPTION OF THE EMBODIMENTS

Figure 1:
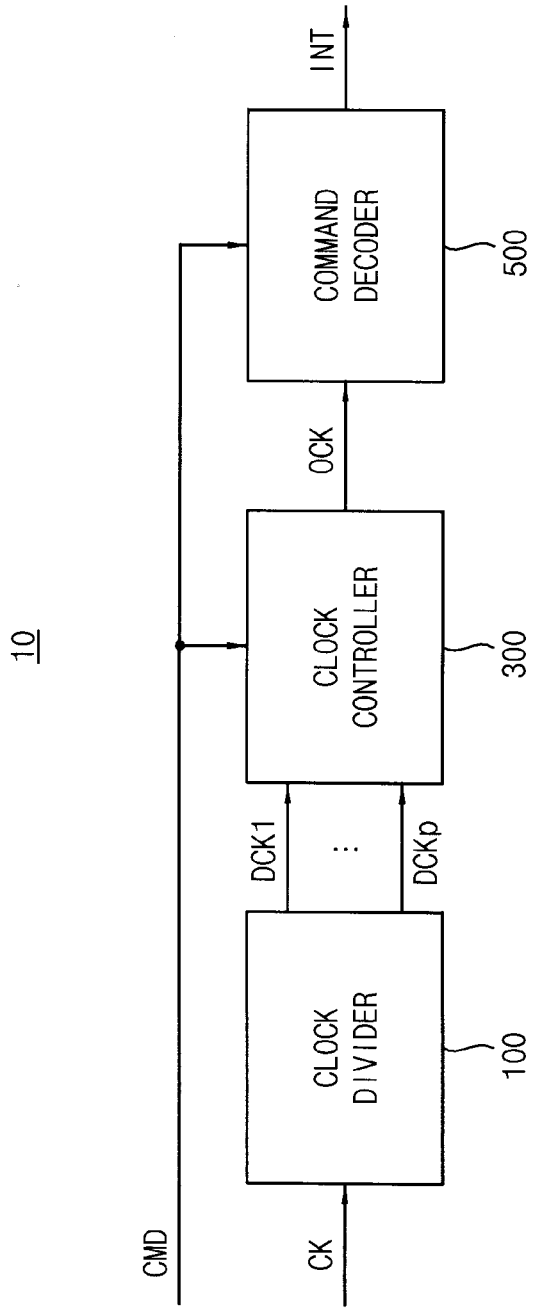
FIG. 1 is a block diagram illustrating a command processing circuit according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
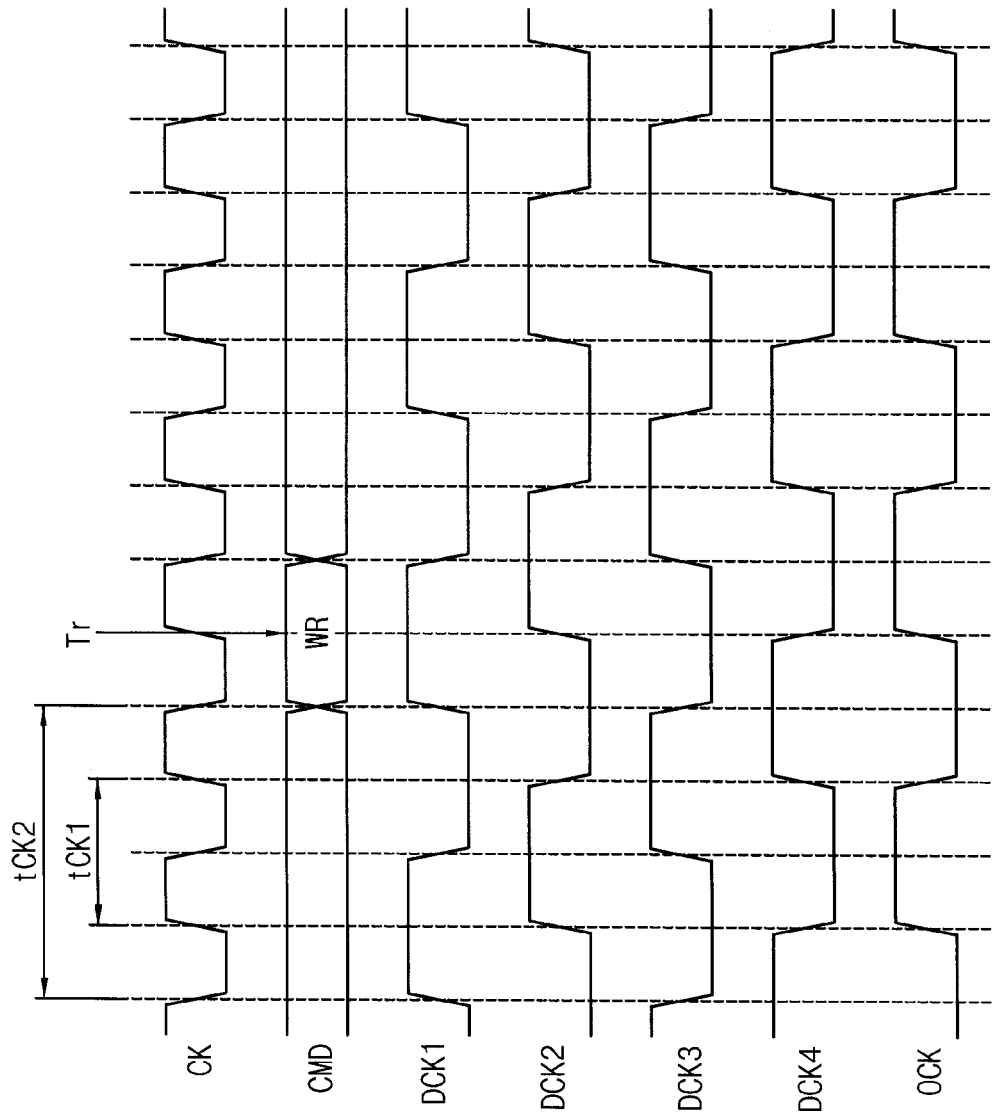
FIG. 2 is a timing diagram illustrating an example operation of the command processing circuit of FIG. 1.

FIG. 1 is a block diagram illustrating a command processing circuit according to example embodiments, and FIG. 2 is a timing diagram illustrating an example operation of the command processing circuit of FIG. 1.

Referring to FIG. 1, a command processing circuit 10 includes a clock divider 100, a clock controller 300 and a command decoder 500. The clock divider 100 generates a plurality of divided clock signals DCK1~DCKp based on an external clock signal CK. The external clock signal CK has a first frequency F1, and the divided clock signals DCK1~DCKp have a second frequency F2 lower than the first frequency F1. Each of the divided clock signals DCK1~DCKp has a phase that is different from phases of the other divided clock signals. The clock controller 300 generates an operating clock signal OCK based on a command signal CMD and the divided clock signals DCK1~DCKp. The command signal CMD is transferred in synchronization with the external clock signal CK. The operating clock signal OCK has the second frequency F2 and a phase corresponding to reception timing of the command signal CMD. The command decoder 500 decodes the command signal CMD in synchronization with the operating clock signal OCK to output an internal signal INT.

FIG. 2 illustrates an example that the clock divider 100 provides the four divided clock signals DCK1~DCK4. The divided clock signals DCK1~DCK4 may have the second frequency F2 (=1/tCK2) corresponding to a half of the first frequency F1 (=1/tCK1). The divided clock signals DCK1~DCK4 may have a phase difference of 90 degrees. The frequency, the number and the phase difference of the divided clock signals may be determined variously depending on the operating conditions of the system including the memory device.

The command signal CMD may be transferred in synchronization with the external clock signal CK. For example, the command signal CMD may be synchronized with the external clock signal CK such that the center portion of the command WR in the command signal CMD is aligned to a rising edge of the external clock signal CK as illustrated in FIG. 2. The command signal CMD may include an active command ACT, a write command WR, a read command RD, etc. as will be described with reference to FIGS. 11, 12 and 13.

The clock controller 300 may detect the reception timing Tr of the command signal CMD and provide the operating clock signal OCK having a phase corresponding to the reception timing Tr. For example, the clock controller 300 may activate one divided clock signal DCK2 having the phase corresponding to the reception timing Tr of the command signal CMD among the divided clock signals DCK1~DCK4. The clock controller 300 may provide the one divided clock signal DCKL2 as the operating clock signal OCK and deactivate the other clock signals DCK1, DCK3 and DCK4 except the one divided clock signal DCK2.

As such, the one clock signal having the reduced frequency with respect to the external clock signal may be activated to efficiently process the command signal and reduce power consumption.

Figure 3:
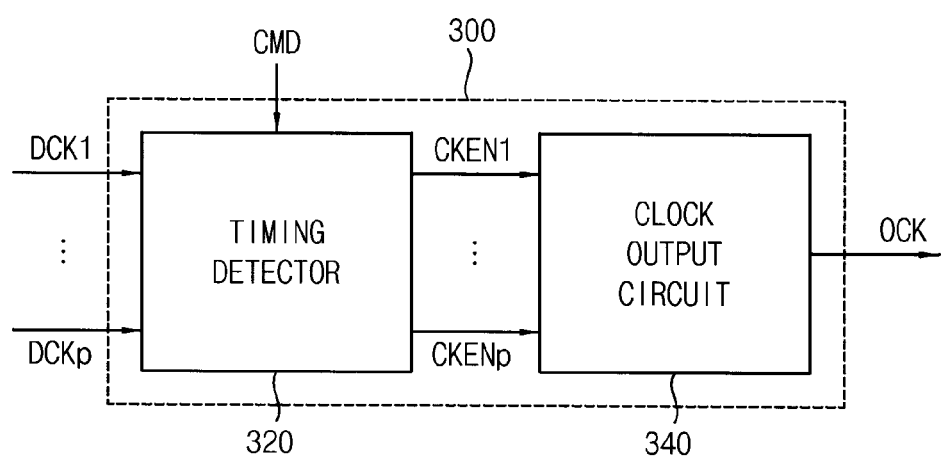
FIG. 3 is a block diagram illustrating an example of a clock controller included in the command processing circuit of FIG. 1.

FIG. 3 is a block diagram illustrating an example of a clock controller included in the command processing circuit of FIG. 1.

Referring to FIG. 3, a clock controller 300 may include a timing detector 320 and a clock output circuit 340. The timing detector 320 may generate a plurality of clock enable signals CKEN1~CKENp by comparing the phases of the divided clock signals DCK1~DCKp with a phase of the command signal CMD. The timing detector 320 may activate one clock enable signal corresponding to the reception timing of the command signal CMD among the clock enable signals CKEN1~CKENp. The clock output circuit 340 may provide the operating clock signal OCK based on the divided clock signals DCK1~DCKp and the clock enable signals CKEN1~CKENp.

The number of the clock enable signals CKEN1~CKENp may be equal to the number of the divided clock signals DCK1~DCKp, and the clock enable signals CKEN1~CKENp may correspond one-to-one to the divided clock signals DCK1~DCKp. Through the phase comparison between the command signal CMD and the respective divided clock signals DCK1~DCKp, the timing detector 320 may detect one divided clock signal having the phase corresponding to the reception timing of the command signal CMD and activate the one clock enable signal corresponding to the one divided clock signal. The clock output circuit 340 may activate the one divided clock signal corresponding to the activated clock enable signal to provide the one divided clock signal as the operating clock signal OCK and deactivate the other divided clock signals.

Figure 4:
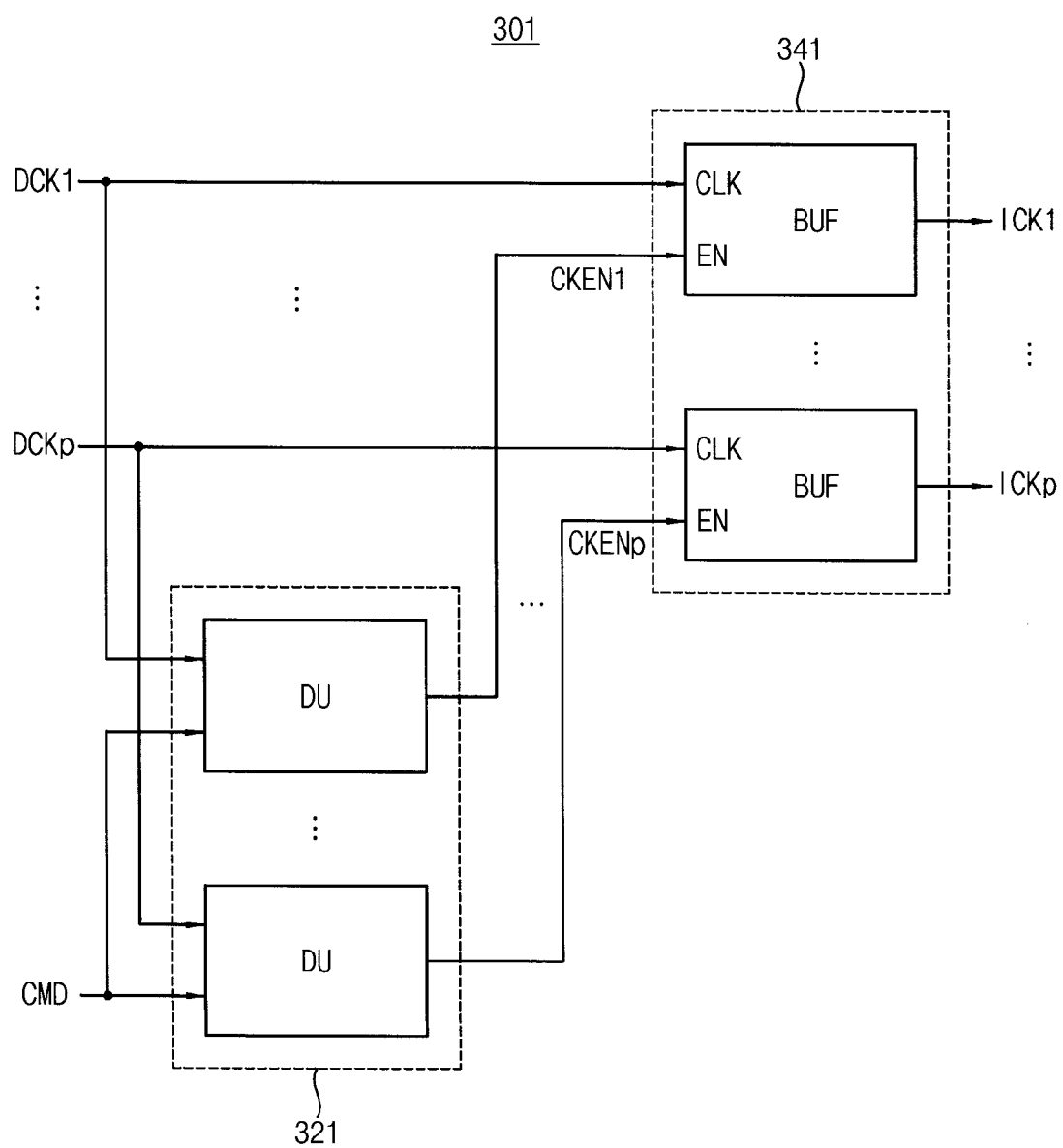
FIG. 4 is a diagram illustrating an example configuration of the clock controller of FIG. 3.
Figure 5:
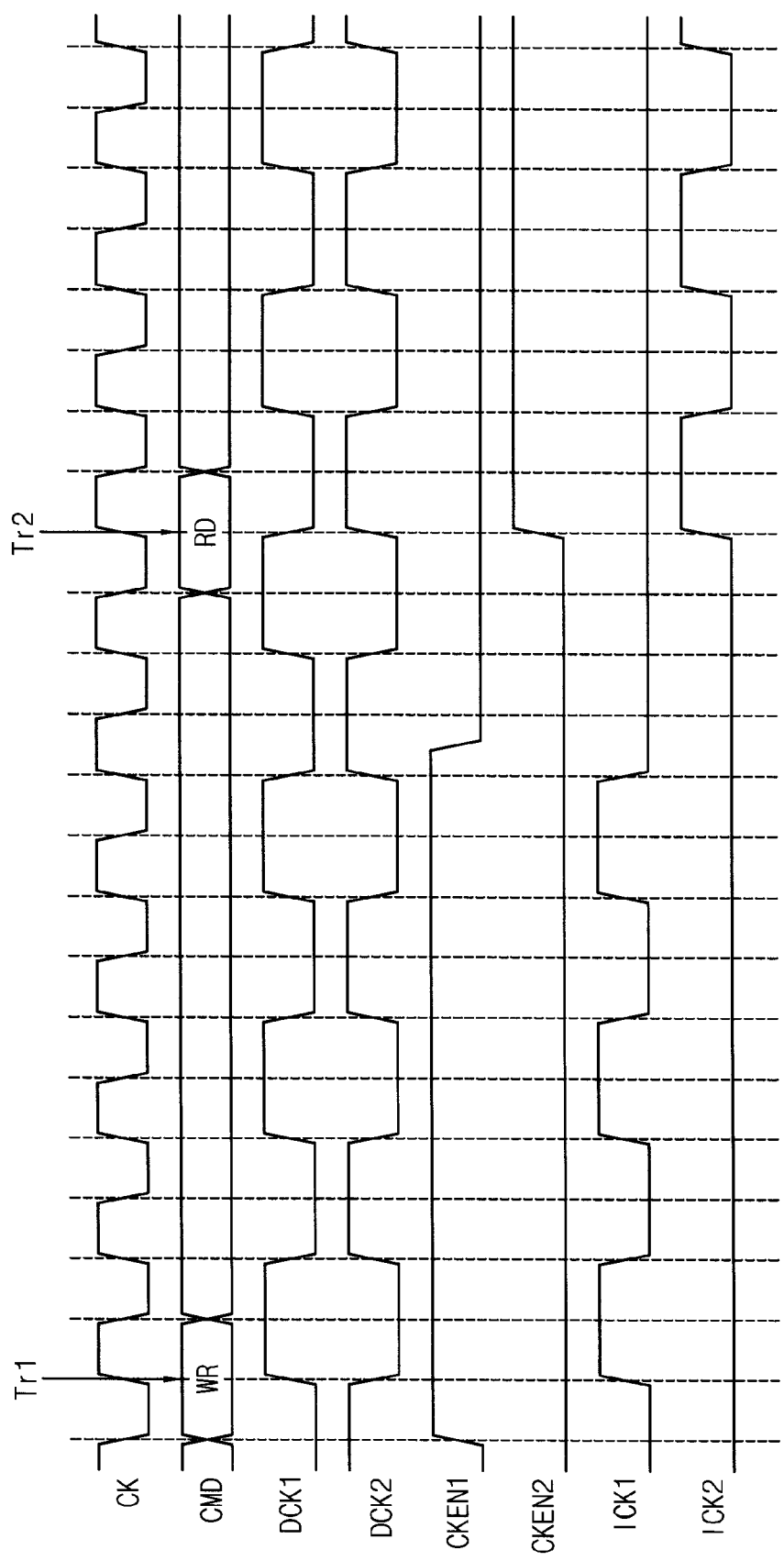
FIG. 5 is a timing diagram illustrating an example operation of the clock controller of FIG. 4.

FIG. 4 is a diagram illustrating an example configuration of the clock controller of FIG. 3, and FIG. 5 is a timing diagram illustrating an example operation of the clock controller of FIG. 4.

Referring to FIG. 4, a clock controller 301 may include a phase detector 321 and a clock output circuit 341.

The timing detector 321 may include a plurality of detection units DUs configured to compare the phases of the divided clock signals DECK1~DCKp with the phase of the command signal CMD to generate a plurality of clock enable signals CKEN1~CKENp, respectively. The detection units DUs may activate the one clock enable signal corresponding to the reception timing of the command signal CMD among the clock enable signals CKEN1~CKENp.

The clock output circuit 341 may include a plurality of clock buffers BUFs configured to buffer the divided clock signals DCK1~DCKp to output a plurality of internal clock signals ICK1~ICKp having the second frequency F2. Each of the plurality of internal clock signals ICK1~ICKp has a phase that is different from phases of the other internal clock signals. Each clock buffer BUF may buffer and output the received divided clock signal if the received clock enable signal is activated, and block or deactivate the received divided clock signal if the received clock enable signal is deactivated. As a result, the one internal clock signal among the internal clock signals, which is output from the clock buffer receiving the one activated clock enable signal, may be activated. The other internal clock signals except the one internal clock signal may be deactivated. The one internal clock signal may be provided as the operating clock signal OCK.

FIG. 5 illustrates an example that the clock divider 100 provides the two divided clock signals DCK1 and DCK2. The divided clock signals DCK1 and DCK2 have the second frequency F2 corresponding to a half of the first frequency F1 of the external clock signal CK and the phase difference of 180 degrees. For example, the first divided clock signal DCK1 may be synchronized with the even-numbered clock of the external clock signal CK, and the second divided clock signal DCK2 may be synchronized with the odd-numbered clock of the external clock signal CK.

When the reception timing Tr1 of the first command WR in the command signal CMD corresponds to the phase of the first divided clock signal DCK1, the timing detector 321 may activate the first clock enable signal CKEN1 and deactivate the second clock enable signal CKEN2. The clock buffers BUFs in the clock output circuit 341 may buffer and output the first divided clock signal DCK1 in response to the activated first clock enable signal CKEN1, and block the second divided clock signal DCK2 in response to the deactivated second clock enable signal CKEN2. As a result, the first internal clock signal ICK1 may be activated to be provided as the operating clock signal OCK and the second internal clock signal ICK2 may be deactivated, when the reception timing Tr1 of the command signal CMD corresponds to the phase of the first divided clock signal DCK1.

When the reception timing Tr2 of the second command RD in the command signal CMD corresponds to the phase of the second divided clock signal DCK2, the timing detector 321 may activate the second clock enable signal CKEN2 and deactivate the first clock enable signal CKEN1. The clock buffers BUFs in the clock output circuit 341 may buffer and output the second divided clock signal DCK2 in response to the activated second clock enable signal CKEN2, and block the first divided clock signal DCK1 in response to the deactivated first clock enable signal CKEN1. As a result, the second internal clock signal ICK2 may be activated to be provided as the operating clock signal OCK and the first internal clock signal ICK1 may be deactivated, when the reception timing Tr2 of the command signal CMD corresponds to the phase of the second divided clock signal DCK2.

As such, the reception timing of the command signal CMD may be detected to activate the one internal clock signal and deactivate the other internal clock signals, thereby reducing power consumption.

Figure 6:
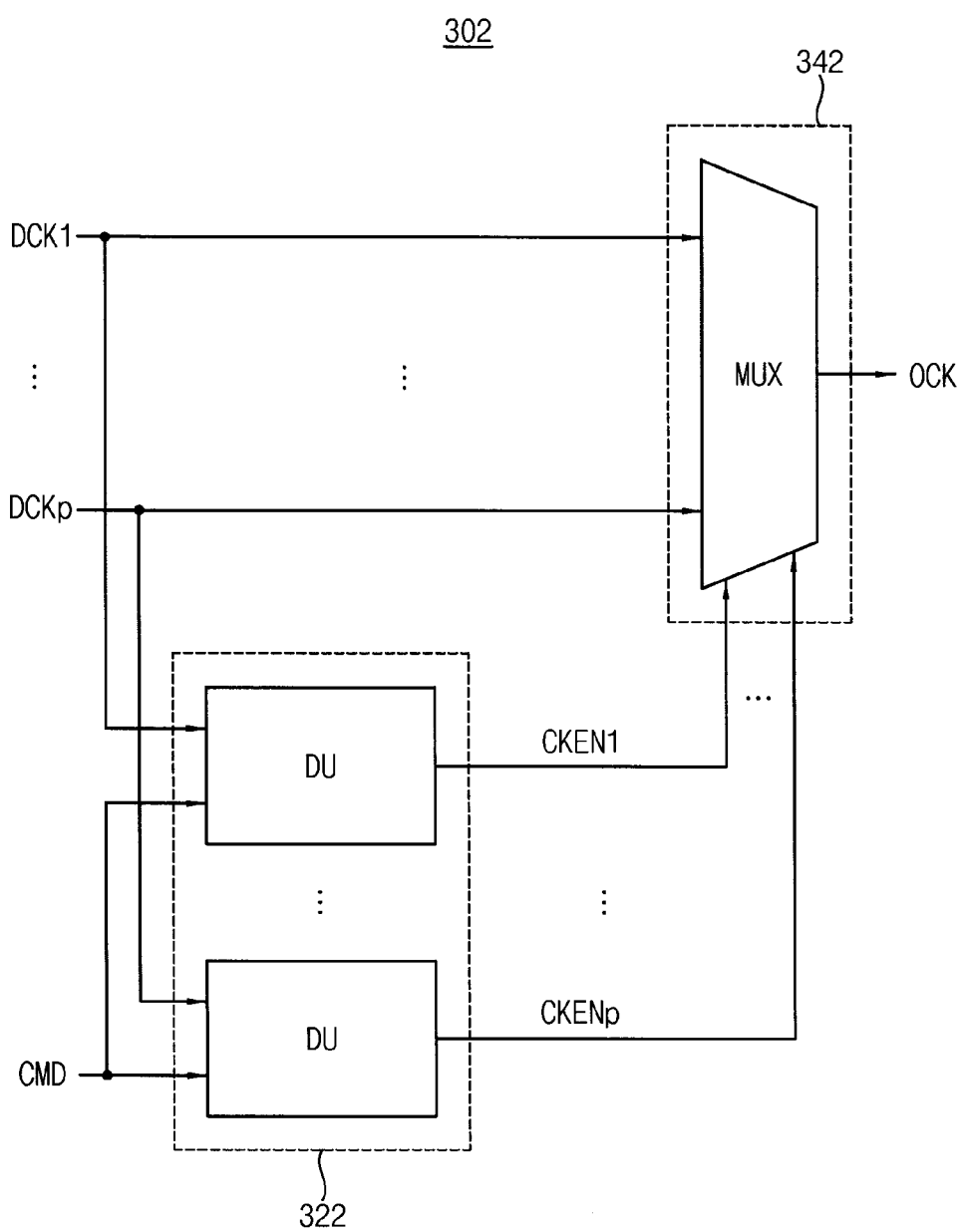
FIG. 6 is a diagram illustrating another example configuration of the clock controller of FIG. 3.
Figure 7:
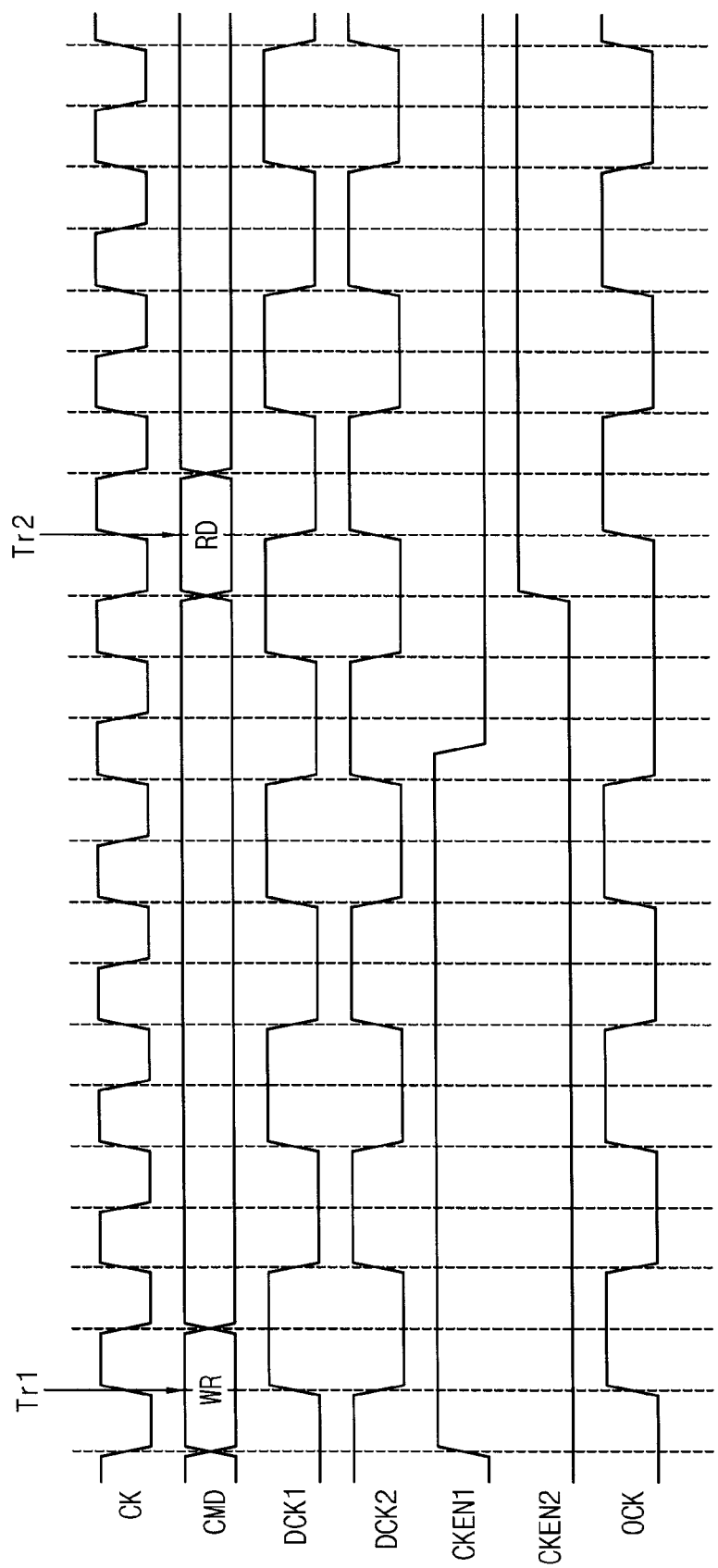
FIG. 7 is a timing diagram illustrating an example operation of the clock controller of FIG. 6.

FIG. 6 is a diagram illustrating another example configuration of the clock controller of FIG. 3, and FIG. 7 is a timing diagram illustrating an example operation of the clock controller of FIG. 6.

Referring to FIG. 6, a clock controller 302 may include a phase detector 322 and a clock output circuit 342.

The timing detector 322 may include a plurality of detection units DUs configured to compare the phases of the divided clock signals DECK1~DCKp with the phase of the command signal CMD to generate a plurality of clock enable signals CKEN1~CKENp, respectively. The detection units DUs may activate the one clock enable signal corresponding to the reception timing of the command signal CMD among the clock enable signals CKEN1~CKENp.

The clock output circuit 342 may include a multiplexer MUX configured to select one divided clock signal among the divided clock signals DCK1~DCKp in response to the clock enable signals CKEN1~CKENp to provide the one divided clock signal as the operating clock signal OCK. As a result, the one divided clock signal among the divided clock signals DCK1~DCKp, which corresponds to the one activated clock enable signal, may be activated. The other divided clock signals except the one divided clock signal may be deactivated. The one divided clock signal may be provided as the operating clock signal OCK.

FIG. 7 illustrates an example that the clock divider 100 provides the two divided clock signals DCK1 and DCK2. The divided clock signals DCK1 and DCK2 have the second frequency F2 corresponding to a half of the first frequency F1 of the external clock signal CK and the phase difference of 180 degrees. For example, the first divided clock signal DCK1 may be synchronized with the even-numbered clock of the external clock signal CK, and the second divided clock signal DCK2 may be synchronized with the odd-numbered clock of the external clock signal CK.

When the reception timing Tr1 of the first command WR in the command signal WR corresponds to the phase of the first divided clock signal DCK1, the timing detector 322 may activate the first clock enable signal CKEN1 and deactivate the second clock enable signal CKEN2. The multiplexer MUX in the clock output circuit 342 may select and output the first divided clock signal DCK1 corresponding to the activated first clock enable signal CKEN1, and block the second divided clock signal DCK2 corresponding to the deactivated second clock enable signal CKEN2. As a result, the first divided clock signal DCK1 may be activated to be provided as the operating clock signal OCK and the second divided clock signal DCK2 may be deactivated, when the reception timing Tr1 of the command signal CMD corresponds to the phase of the first divided clock signal DCK1.

When the reception timing Tr2 of the second command RD in the command signal CMD corresponds to the phase of the second divided clock signal DCK2, the timing detector 322 may activate the second clock enable signal CKEN2 and deactivate the first clock enable signal CKEN1. The multiplexer MUX in the clock output circuit 342 may select and output the second divided clock signal DCK2 corresponding to the activated second clock enable signal CKEN2, and block the first divided clock signal DCK1 corresponding to the deactivated first clock enable signal CKEN1. As a result, the second divided clock signal DCK2 may be activated to be provided as the operating clock signal OCK and the first divided clock signal DCK1 may be deactivated, when the reception timing Tr2 of the command signal CMD corresponds to the phase of the second divided clock signal DCK2.

As such, the reception timing of the command signal CMD may be detected to activate the one internal clock signal and deactivate the other internal clock signals, thereby reducing power consumption.

Figure 8:
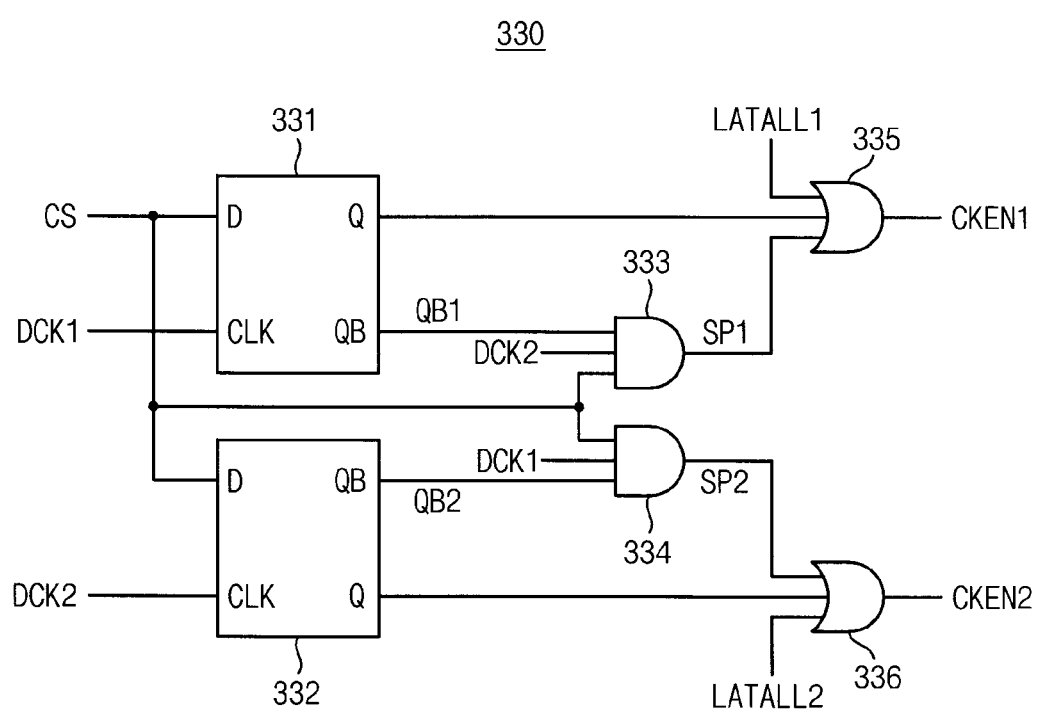
FIG. 8 is a circuit diagram illustrating an example of a timing detector included in the clock controller of FIG. 3.
Figure 9:
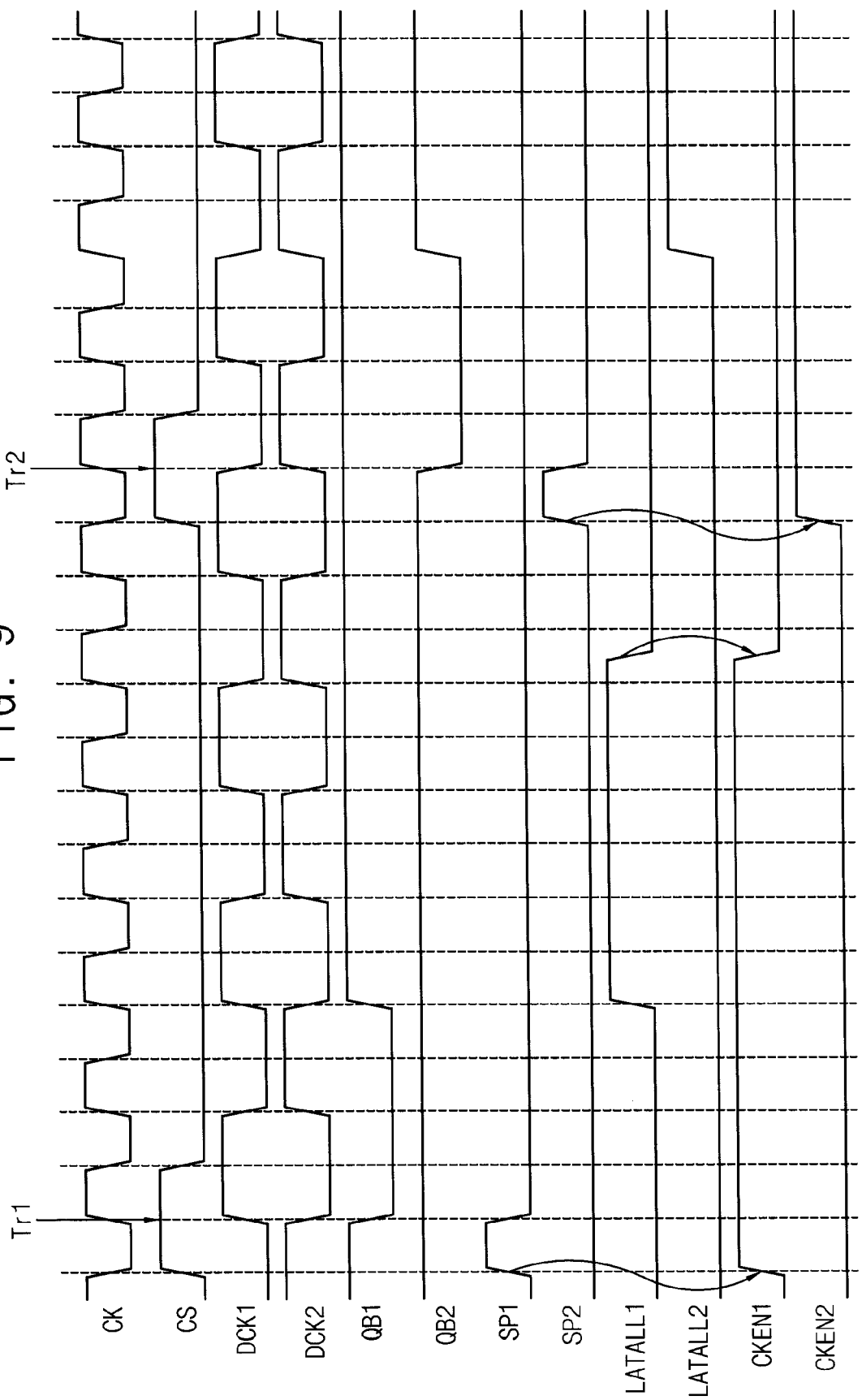
FIG. 9 is a timing diagram illustrating an example operation of the timing detector of FIG. 8.

FIG. 8 is a circuit diagram illustrating an example of a timing detector included in the clock controller of FIG. 3, and FIG. 9 is a timing diagram illustrating an example operation of the timing detector of FIG. 8.

Referring to FIG. 8, a timing detector 330 may include a first flip-flop 331, a second flip-flop 332, a first AND logic gate 333, a second AND logic gate 334, a first OR logic gate 335 and a second OR logic gate 336.

The first flip-flop 331 may latch a chip selection signal CS in response to a first divided clock signal DCK1, and the second flip-flop 332 may latch the chip selection signal CS in response to a second divided clock signal DCK2. The first AND logic gate 333 may perform AND logic operation on an inversion output of the first flip-flop 331, the chip selection signal CS and the second divided clock signal DCK2. The second AND logic gate 334 may perform AND logic operation on an inversion output of the second flip-flop 332, the chip selection signal CS and the first divided clock signal DCK1. The first OR logic gate 335 may perform OR logic operation on an output of the first flip-flop 331, an output of the first AND logic gate 333 and a first latency alignment signal LATALL1 to output a first clock enable signal CKEN1. The second OR logic gate 336 may perform OR logic operation on an output of the second flip-flop 332, an output of the second AND logic gate 334 and a second latency alignment signal LATALL2 to output a second clock enable signal CKEN2.

FIG. 9 illustrates an example that the clock divider 100 provides the two divided clock signals DCK1 and DCK2. The divided clock signals DCK1 and DCK2 have the second frequency F2 corresponding to a half of the first frequency F1 of the external clock signal CK and the phase difference of 180 degrees. For example, the first divided clock signal DCK1 may be synchronized with the even-numbered clock of the external clock signal CK, and the second divided clock signal DCK2 may be synchronized with the odd-numbered clock of the external clock signal CK.

FIG. 9 shows the signals CK, CS, DCK1, DCK2, LATALL1 and LATALL2 received by the timing detector 330, the signals QB1, QB2, SP1 and SP2 generated internally by the timing detector 330 and the clock enable signals CKEN1 and CKEN2 output finally by the timing detector 330.

When the reception timing Tr1 of the chip selection signal CS corresponds to the phase of the first divided clock signal DCK1, the output OB1 of the first flip-flop 331 and the output SP1 of the first AND logic gate 333 are activated, and the output OB2 of the second flip-flop 332 and the output SP2 of the second AND logic gate 334 are deactivated. As a result, the first clock enable signal CKEN1 from the first OR logic gate 335 is activated, and the second clock enable signal CKEN2 from the second OR logic gate 336 is deactivated.

When the reception timing Tr2 of the chip selection signal CS corresponds to the phase of the second divided clock signal DCK2, the output OB1 of the first flip-flop 331 and the output SP1 of the first AND logic gate 333 are deactivated, and the output OB2 of the second flip-flop 332 and the output SP2 of the second AND logic gate 334 are activated. As a result, the second clock enable signal CKEN2 from the second OR logic gate 336 is activated, and the first clock enable signal CKEN1 from the first OR logic gate 335 is deactivated.

As such, the timing detector 330 in the clock controller 300 may detect the reception timing of the command signal CMD based on the chip selection signal CS, and may provide the detected reception timing using the clock enable signals CKEN1 and CKEN2 that are activated selectively.

As illustrated in FIG. 9, the activation timings of the clock enable signals CKEN1 and CKEN2 may be determined in response to the outputs SP1 and SP2 of the AND logic gates 333 and 334, and the deactivation timings of the clock enable signals CKEN1 and CKEN2 may be determined in response to the latency alignment signals LATALL1 and LATALL2. The latency alignment signals LATALL1 and LATALL2 may be provided from the command decoder 500 in FIG. 1. Particularly, the latency alignment signals LATALL1 and LATALL2 may be provided from timing control logics TIMs included in a command decoder 1430 in FIG. 16. The timing control logics TIMs may generate the first latency alignment signal LATALL1 and the second latency alignment signal LATALL2 based on values stored in a mode register set (MRS).

Figures 10, 11:
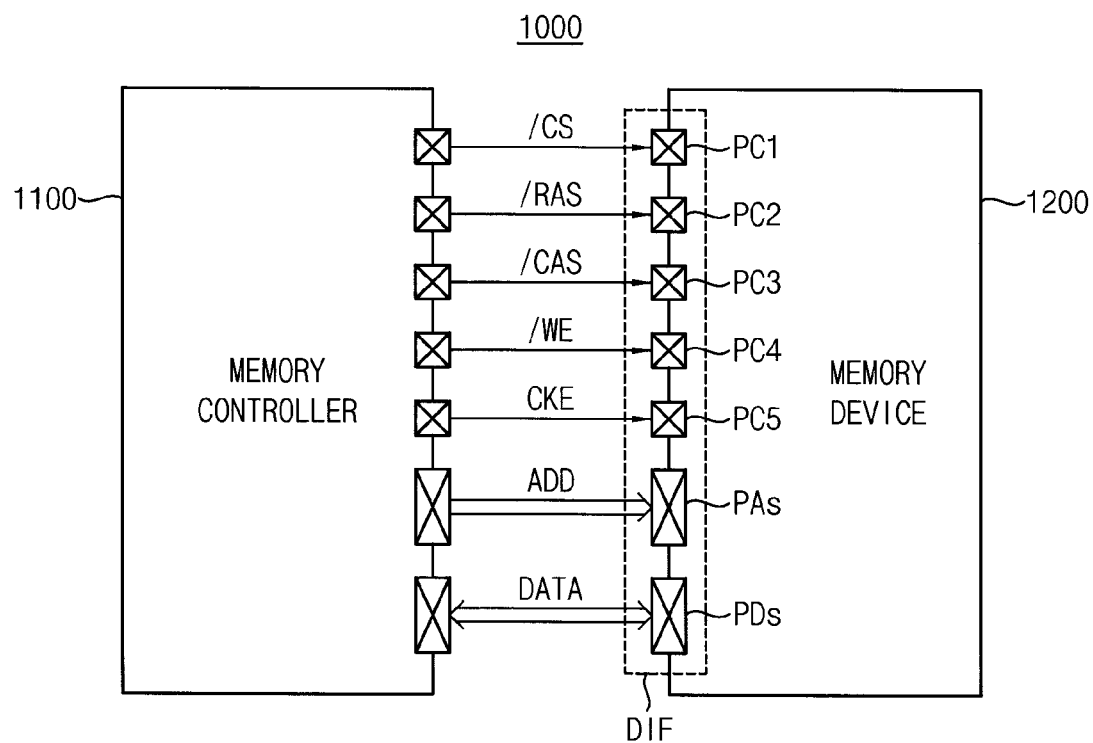
FIG. 10 is a diagram illustrating a memory system according to example embodiments.
FIGS. 11, 12 and 13 are diagrams for describing commands received by a memory device according to example embodiments.

FIG. 10 is a diagram illustrating a memory system according to example embodiments.

Referring to FIG. 10, a memory system 1000 includes a memory controller 1100 and a memory device 1200. The memory device 1200 may include an interface such as a DRAM interface DIF for communicating with the memory controller 1100. The DRAM interface DIF may include control pads (or pins) PC1 through PC5, address pads PAs and data pads PDs. The memory device 1200 may receive control signals such as a chip selection signal/CS, a row address strobe signal/RAS, a column address strobe signal/CAS, a write enable signal/WE, a clock enable signal CKE, etc. through the control pads PC1 through PC5. The memory device 1200 may receive the address signal ADD through the address pads PAs, and receive the write data or transmit the read data through the data pads PDs.

The DRAM interface DIF may be implemented in many ways according to the DRAM standard. Even though not illustrated in FIG. 10, the DRAM interface DIF may further include pads for receiving a clock signal, a power supply voltage, etc.

Figure 12:
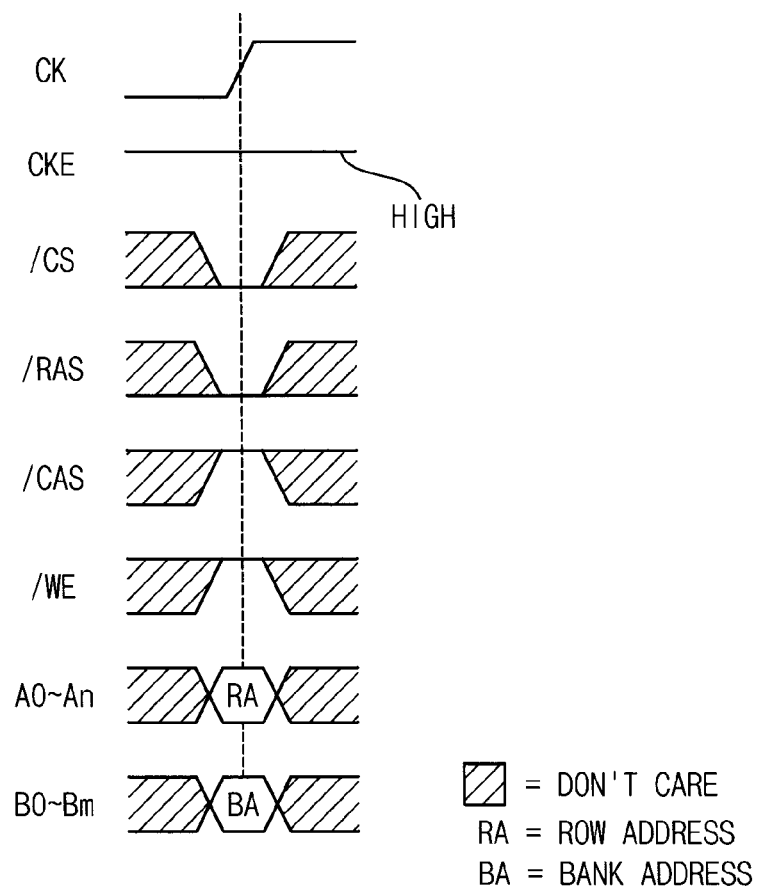
Figure 13:
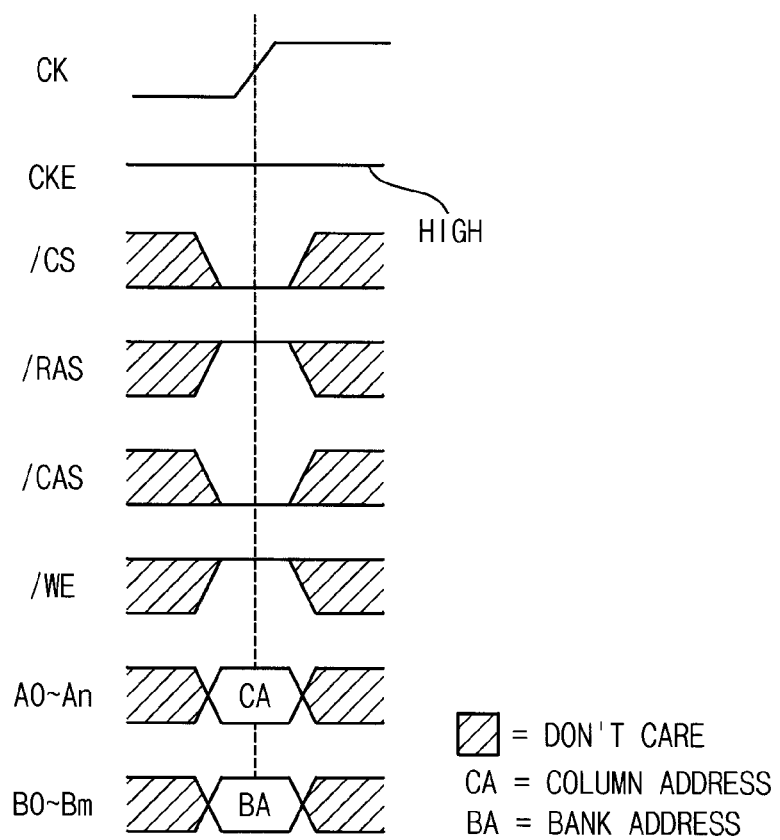

FIGS. 11, 12 and 13 are diagrams for describing commands received by a memory device according to example embodiments.

FIG. 11 illustrates a portion of the command truth table according to the DRAM standard for convenience of illustration, which includes some commands for describing the example embodiments. As illustrated in FIG. 11, the active command ACT, the read command RD, the write command WR, etc. may be represented by combinations of logic levels H and L of the control signals/CS,/RAS,/CAS and/WE. The memory device 1200 in FIG. 10 may receive the bank address BA and the row address RA with the active command ACT from the memory controller 1100 to perform the RAS addressing for selecting the memory bank and the wordline. In addition, the memory device 1200 may receive the column address CA with the read command RD or the write command WR from the memory controller 1100 to perform the CAS addressing for selecting the bitline.

FIG. 12 illustrates the combination of the control signals CKE,/CS,/RAS,/RAS and/WE corresponding to the active command ACT. For example, in response to a rising edge of the clock signal CK, the memory device 1200 may determine whether the active command ACT is received when the logic levels of the control signals CKE,/CS,/RAS,/RAS and/WE are as illustrated in FIG. 12.

The memory device 1200 may, with the active command ACT, receive the row address RA and the bank address BA through the address pins A0~An and the bank address pins B0~Bm. When the memory device 1200 includes a single memory bank, the bank address pins B0~Bm and the bank address BA may be omitted.

Before the read command RD or the write command WR is issued, one memory bank corresponding to the bank address BA and one row (e.g., wordline) corresponding to the row address RA have to be opened. Such RAS addressing may be performed in response to the transfer of the active command ACT.

FIG. 13 illustrates the combination of the control signals CKE,/CS,/CAS,/RAS and/WE corresponding to the read command RD. For example, in response to a rising edge of the clock signal CK, the memory device 1200 may determine whether the read command RD is received when the logic levels of the control signals CKE,/CS,/CAS,/RAS and/WE are as illustrated in FIG. 13.

The memory device 1200 may, with the read command RD, receive the column address CA and the bank address BA through the address pins A0~An and the bank address pins B0~Bm. The transfer of the bank address BA may be omitted in case of the read command RD.

One column (e.g., bitline) corresponding to the column address CA has to be opened with respect to the row opened by the active command ACT. Such CAS addressing may be performed in response to the transfer of the read command RD.

Through such RAS addressing and CAS addressing, at least one memory cell may be selected or accessed among a plurality of memory cells, and the data stored in the selected memory cell may be sensed.

As described above, the command signal CMD is transferred in synchronization with the external clock signal CK. According to example embodiments, only one clock signal is activated as the operating clock signal OCK among the divided clock signals DCK1~DCKp or the internal clock signals ICK1~ICKp having the lower frequency than the external clock signal CK, and thus the power consumption may be reduced. The selection of the operating clock signal OCK may be performed by detecting the reception timing of the command signal CMD. For example, as described with reference to FIGS. 8 and 9, the reception timing of the command signal CMD may be detected based on the chip selection signal that is commonly activated in case of the read command RD and the write command WR.

Even though the memory system according to the DRAM standard has been described with reference to FIGS. 10, 11, 12 and 13, it would be understood that the command processing circuit and the memory device according to example embodiments may be applied to the memory systems according to various memory standards.

Figure 14:
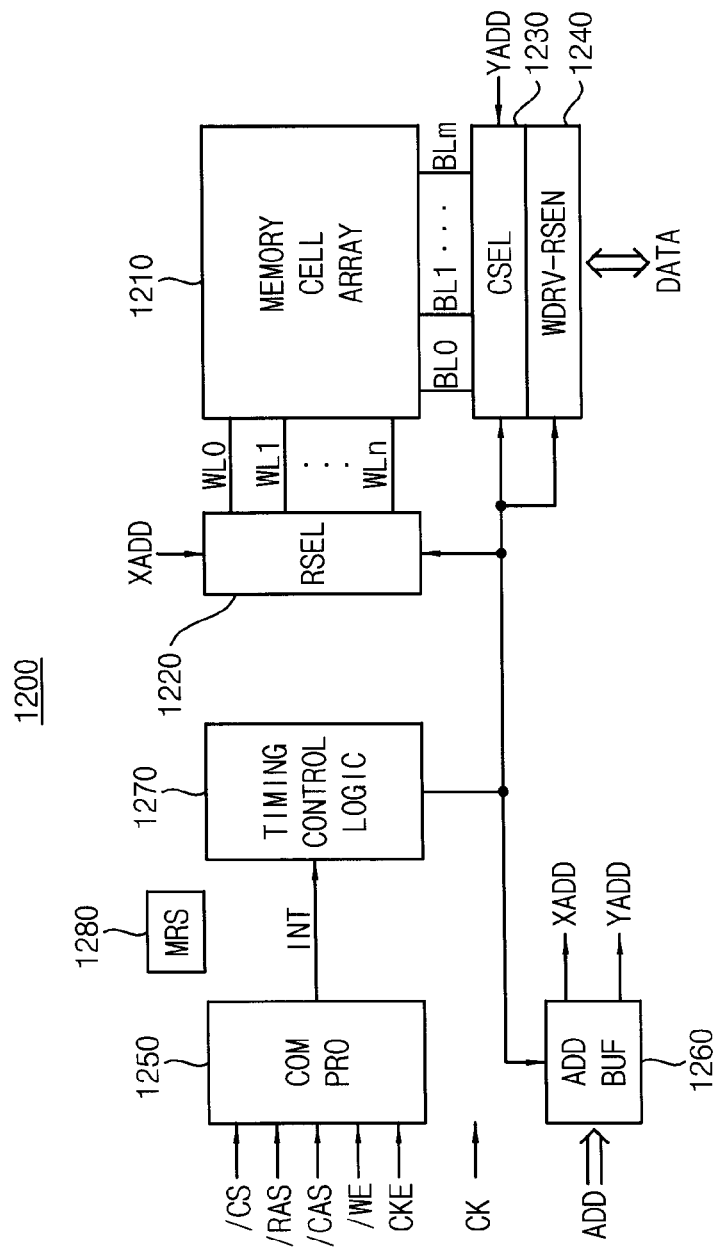
FIG. 14 is a block diagram illustrating a memory device according to example embodiments.

FIG. 14 is a block diagram illustrating a memory device according to example embodiments.

Referring to FIG. 14, a memory device 1200 may include a cell array 1210, a row selection circuit (RSEL) 1220, a column selection circuit (CSEL) 1230, an input-output circuit 1240, a command processing circuit (COM PRO) 1250, an address buffer (ADD BUF) 1260, a timing control logic 1270 and a mode register set (MRS) 1280. The input-output circuit 1240 may include a write driver WDRV and a read sensing circuit RSEN.

The cell array 1210 may include a plurality of memory cells respectively coupled to a plurality of wordlines WL0 through WLn and a plurality of bitlines BL0 through BLm.

The command processing circuit 1250 may generate internal signals INT based on the control signals/CS,/RAS,/CAS,/WE and CKE from the memory controller 1100 in FIG. 10. The internal signal INT may include the first latency alignment signal LATALL1 and the second latency alignment signal LATALL2 as described with reference to FIGS. 8 and 9. The command processing circuit 1250 may generate the latency alignment signals LATALL1 and LATALL2 based on the values stored in the mode register set 1280. The mode register set 1280 may store various default values for the operations of the memory device 1200 such as the latency values representing delay times required for completion of the various operations. In addition, the internal signal INT may include internal command signals such as an internal RAS signal, an internal CAS signal, an internal read enable signal RDEN, an internal write enable signal WREN, etc. The internal RAS signal IRAS may be activated at a time point when the active command ACT is received, and the internal CAS signal ICAS may be activated at a time point when the read command RD or the write command WR is received. The internal read enable signal RDEN may be activated at a time point when the read command RD is received, and the internal write enable signal WREN may be activated at a time point when the write command WR is received.

The timing control logic 1270 may generate timing control signals based on the internal command signals IRAS, ICAS, RDEN and WREN. The timing control signals may include a precharge signal PCHB, a column selection enable signal CSEN, etc.

The address buffer 1260 may generate a row address signal XADD and a column address signal YADD based on an external address ADD transferred from the memory controller 1100. The row address signal XADD may be provided to the row selection circuit 1220, and the column address signal YADD may be provided to the column selection circuit 1230.

The row selection circuit 1220 may select a wordline corresponding to the row address signal XADD among the wordlines WL0 through WLn in response to the timing control signals from the timing control logic 1270. The column selection circuit 1230 may select a bitline corresponding to the column address signal YADD among the bitlines BL0 through BLm in response to the timing control signals from the timing control logic 1270.

Figure 16:
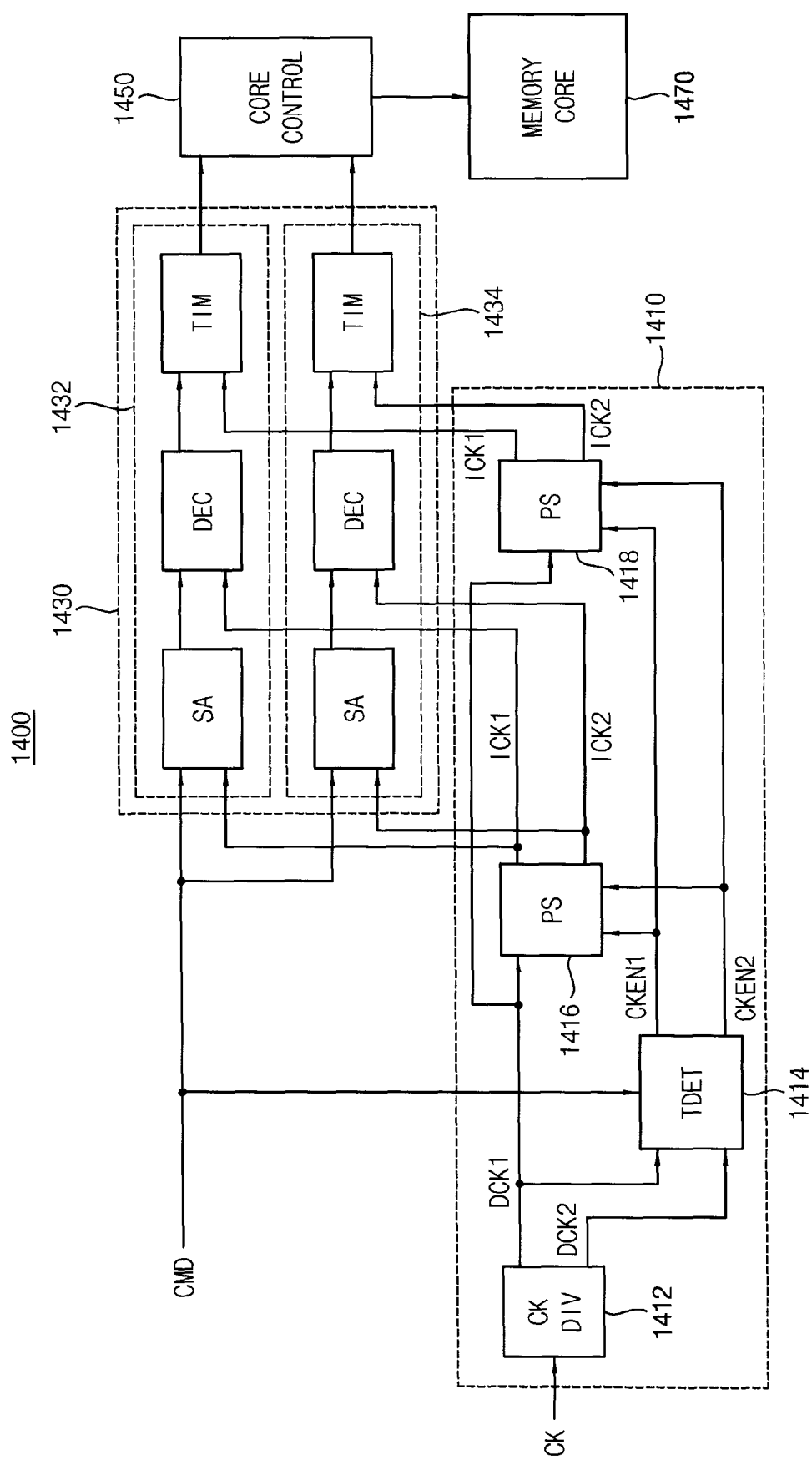
Figure 17:
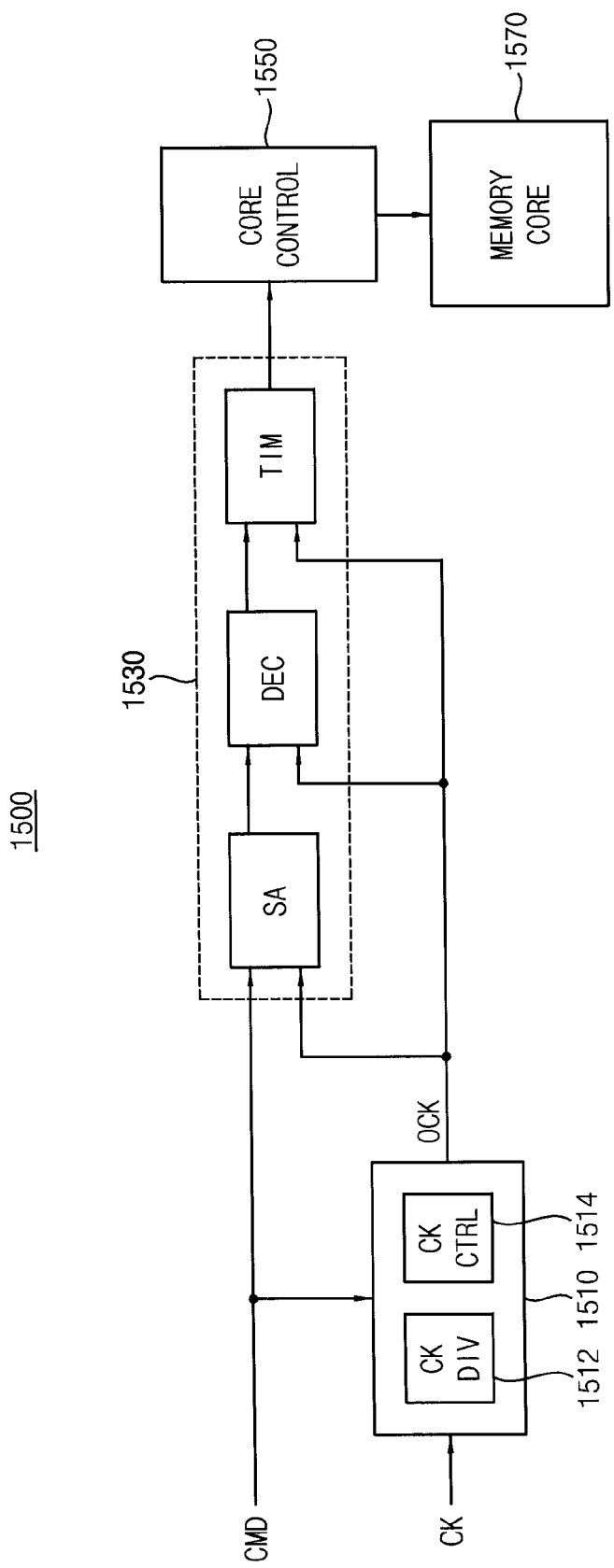

The write driver WDRV and the read sensing circuit RSEN may be coupled to the bitlines BL0 through BLm. The write driver WDRV and the read sensing circuit RSEN may be coupled to the bitlines BL0 through BLm directly or via the column selection circuit 1230. The write driver WDRV may program the write data in the memory cells. The write driver WDRV may be formed integrally with the read sensing circuit RSEN, or the write driver WDRV may be formed as a circuit distinct from the read sensing circuit RSEN FIGS. 15, 16 and 17 are block diagrams illustrating a memory device including a command processing circuit according to example embodiments.

Figure 15:
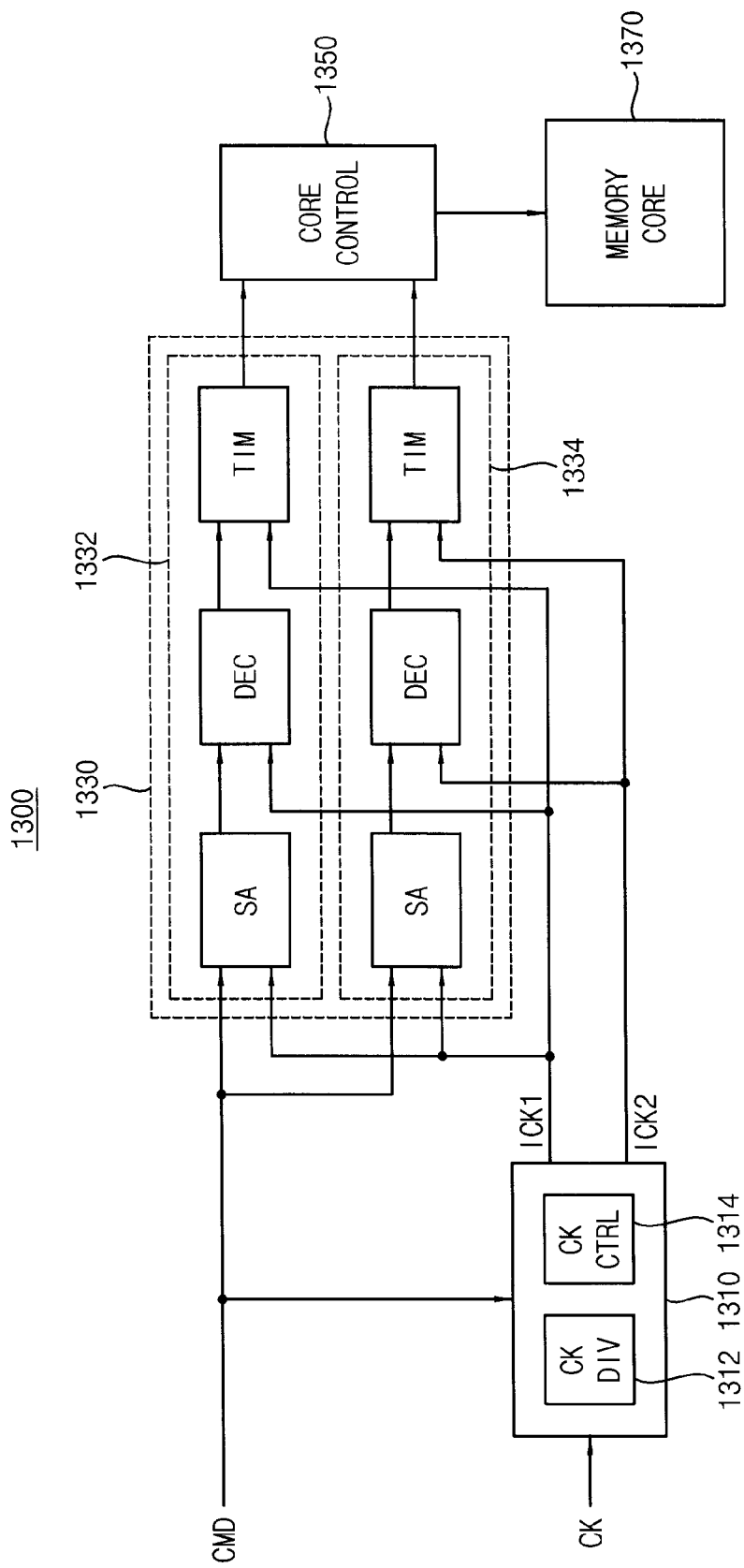
FIGS. 15, 16 and 17 are block diagrams illustrating a memory device including a command processing circuit according to example embodiments.

Referring to FIG. 15, a memory device 1300 may include a clock provider 1310, a command decoder 1330, a core control circuit 1350 and a memory core 1370. The clock provider 1310 and the command decoder 1330 correspond to the command processing circuit as described above. The command processing circuit 1310 and 1330 may decode a command signal CMD from an external device such as a memory controller, and the core control circuit 1350 may generate control signals based on outputs of the command decoder 1330 for controlling the operation of the memory core 1370.

The clock provider 1310 may include the clock divider (CK DIV) 1312 and the clock controller (CK CTRL) 1314 as described above. The clock divider 1312 generates a plurality of divided clock signals DCK1 and DCK2 based on an external clock signal CK. The external clock signal CK has a first frequency F1, and the divided clock signals DCK1 and DCK2 have a second frequency F2 lower than the first frequency F1. One of the divided clock signals DCK1 and DCK2 has a phase that is different from a phase of the other divided clock signal. The clock controller 1314 generates an operating clock signal OCK based on the command signal CMD and the divided clock signals DCK1 and DCK2. The command signal CMD is transferred in synchronization with the external clock signal CK. The operating clock signal OCK has the second frequency F2 and a phase corresponding to reception timing of the command signal CMD.

As described with reference to FIGS. 4 and 5, the clock controller 1314 may include a plurality of clock buffers BUFs configured to buffer the divided clock signals DCK1 and DCK2 to output a plurality of internal clock signals ICK1 and ICK2 having the second frequency F2. One of the plurality of internal clock signals ICK1 and ICK2 has a phase that is different from a phase of the other internal clock signal. The one internal clock signal among the internal clock signals ICK1 and ICK2, which is output from the clock buffer receiving the one activated clock enable signal, may be activated. The other internal clock signals except the one internal clock signal may be deactivated. The one internal clock signal may be provided as the operating clock signal OCK.

The command decoder 1330 may include a plurality of decoding units 1332 and 1334 coupled to outputs of the clock buffers to receive the internal clock signals ICK1 and ICK2, respectively. One decoding unit among the decoding units 1332 and 1334, which receives the operating clock signal, may be enabled to decode the command signal CMD. The other decoding units except the one decoding unit may be disabled. As illustrated in FIG. 15, each of the decoding units 1332 and 1334 may include a sense amplifier SA, a decoder DEC and a timing control logic TIM, which are cascade-coupled to perform a pipe-line operation. In some example embodiments, at least a portion of the timing control logic TIM may be included in the core control circuit 1350.

Referring to FIG. 16, a memory device 1400 may include a clock provider 1410, a command decoder 1430, a core control circuit 1450 and a memory core 1470. The clock provider 1410 and the command decoder 1430 correspond to the command processing circuit as described above. The command processing circuit 1410 and 1430 may decode a command signal CMD from an external device such as a memory controller, and the core control circuit 1450 may generate control signals based on outputs of the command decoder 1430 for controlling the operation of the memory core 1470.

The clock provider 1410 may include a clock divider (CK DIV) 1412, a timing detector (TDET) 1414, and one or more phase splitters (PSs) 1416 and 1418. The clock divider 1412 generates a plurality of divided clock signals DCK1 and DCK2 based on an external clock signal CK. The external clock signal CK has a first frequency F1, and the divided clock signals DCK1 and DCK2 have a second frequency F2 lower than the first frequency F1. One of the divided clock signals DCK1 and DCK2 has a phase that is different from a phase of the other divided clock signal. The timing detector 1414 may generate a plurality of clock enable signals CKEN1 and CKEN2 by comparing the phases of the divided clock signals DCK1 and DCK2 with a phase of the command signal CMD. The timing detector 1414 may activate one clock enable signal corresponding to the reception timing of the command signal CMD among the clock enable signals CKEN1 and CKEN2.

The phase splitters 1416 and 1418 may receive one divided clock signal DCK1 among the divided clock signals DCK1 and DCK2, and may adjust a phase of the one divided clock signal DCK2 to output a plurality of internal clock signals ICK1 and ICK2 having the second frequency F2. One of the plurality of internal clock signals ICK1 and ICK2 has a phase that is different from a phase of the other internal clock signal. The phase splitters 1416 and 1418 may activate one internal clock signal among the internal clock signals ICK1 and ICK2, which corresponds to the one activated clock enable signal, and may deactivate the other internal clock signals except the one internal clock signal. The phase splitters 1416 and 1418 may be provided as the operating clock signal OCK.

The command decoder 1430 may include a plurality of decoding units 1432 and 1434 coupled to outputs of the phase splitters 1416 and 1418 to receive the internal clock signals ICK1 and ICK2, respectively. One decoding unit among the decoding units 1432 and 1434, which receives the operating clock signal OCK, may be enabled to decode the command signal CMD. The other decoding units except the one decoding unit may be disabled. As illustrated in FIG. 16, each of the decoding units 1432 and 1434 may include a sense amplifier SA, a decoder DEC and a timing control logic TIM, which are cascade-coupled to perform a pipe-line operation. In some example embodiments, at least a portion of the timing control logic TIM may be included in the core control circuit 1450.

The phase splitters 1416 and 1418 may be disposed closer to the command decoder 1430 than to the clock divider 1412. In general, skews between the clock signals increase as a transmission distance of the clock signals increases. The clock skews may be reduced by disposing the phase splitters 1416 and 1418, which receive the one divided clock signal DCK1 to generate the internal clock signals ICK1 and ICK2, near the command decoder 1430, which receives the internal clock signals ICK1 and ICK2.

Referring to FIG. 17, a memory device 1500 may include a clock provider 1510, a command decoder 1530, a core control circuit 1550 and a memory core 1570. The clock provider 1510 and the command decoder 1530 correspond to the command processing circuit as described above. The command processing circuit 1510 and 1530 may decode a command signal CMD from an external device such as a memory controller, and the core control circuit 1550 may generate control signals based on outputs of the command decoder 1530 for controlling the operation of the memory core 1570.

The clock provider 1510 may include the clock divider (CK DIV) 1512 and the clock controller (CK CTRL) 1514 as described above. The clock divider 1512 generates a plurality of divided clock signals DCK1 and DCK2 based on an external clock signal CK. The external clock signal CK has a first frequency F1, and the divided clock signals DCK1 and DCK2 have a second frequency F2 lower than the first frequency F1. One of the divided clock signals DCK1 and DCK2 has a phase that is different from a phase of the other divided clock signal. The clock controller 1514 generates an operating clock signal OCK based on the command signal CMD and the divided clock signals DCK1 and DCK2. The command signal CMD is transferred in synchronization with the external clock signal CK. The operating clock signal OCK has the second frequency F2 and a phase corresponding to reception timing of the command signal CMD.

As described with reference to FIGS. 6 and 7, the clock controller 1514 may include the multiplexer MUX configured to select one divided clock signal among the divided clock signals DCK1 and DCK2 in response to the clock enable signals CKEN1 and CKEN2 to provide the one divided clock signal as the operating clock signal OCK.

The command decoder 1530 may include a single decoding unit coupled to an output of the multiplexer MUX to receive the operating clock signal OCK and decode the command signal CMD in synchronization with the operating clock signal OCK.

As illustrated in FIG. 17, the single decoding unit 1530 may include a sense amplifier SA, a decoder DEC and a timing control logic TIM, which are cascade-coupled to perform a pipe-line operation. In some example embodiments, at least a portion of the timing control logic TIM may be included in the core control circuit 1550.

As such, the one clock signal having the reduced frequency with respect to the external clock signal may be activated to efficiently process the command signal and reduce power consumption.

Figure 18:
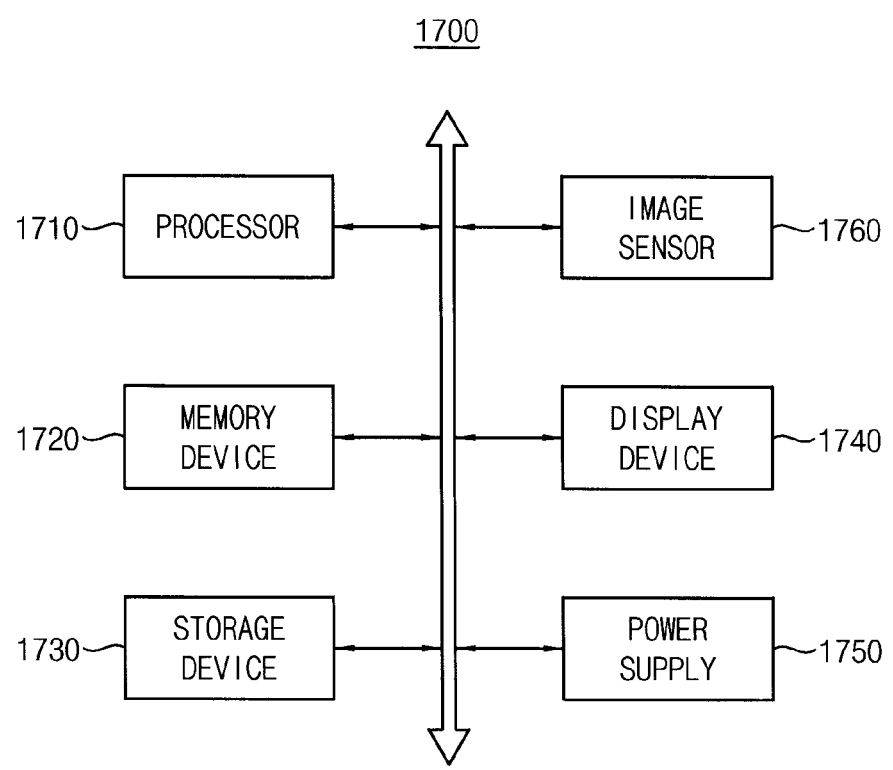
FIG. 18 is a block diagram illustrating a mobile device including a memory system according to example embodiments.

FIG. 18 is a block diagram illustrating a mobile device including a memory system according to example embodiments.

Referring to FIG. 18, a mobile device 1700 may include a processor 1710, a memory device 1720, a storage device 1730, a display device 1740, a power supply 1750 and an image sensor 1760. The mobile device 1700 may further include ports that communicate with a video card, a sound card, a memory card, a USB device, other electronic devices, etc.

The processor 1710 may perform various calculations or tasks. According to embodiments, the processor 1710 may be a microprocessor or a CPU. The processor 1710 may communicate with the memory device 1720, the storage device 1730, and the display device 1740 via an address bus, a control bus, and/or a data bus. In some embodiments, the processor 1710 may be coupled to an extended bus, such as a peripheral component interconnection (PCI) bus.

The memory device 1720 may include a command processing circuit as described with reference to FIGS. 1 through 17. The command processing circuit may activate the one clock signal having the reduced frequency with respect to the external clock signal to efficiently process the command signal and reduce power consumption. The memory device 1720 may store data for operating the mobile device 1700. For example, the memory device 1720 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The storage device 1730 may include a solid state drive (SSD), a hard disk drive (HDD), a CD-ROM, etc. The mobile device 1700 may further include an input device such as a touchscreen, a keyboard, a keypad, a mouse, etc., and an output device such as a printer, a display device, etc. The power supply 1750 supplies operation voltages for the mobile device 700.

The image sensor 1760 may communicate with the processor 1710 via the buses or other communication links. The image sensor 1760 may be integrated with the processor 1710 in one chip, or the image sensor 1760 and the processor 1710 may be implemented as separate chips.

At least a portion of the mobile device 1700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP). The mobile device 1700 may be a digital camera, a mobile phone, a smart phone, a portable multimedia player (PMP), a personal digital assistant (PDA), a computer, etc.

Figure 19:
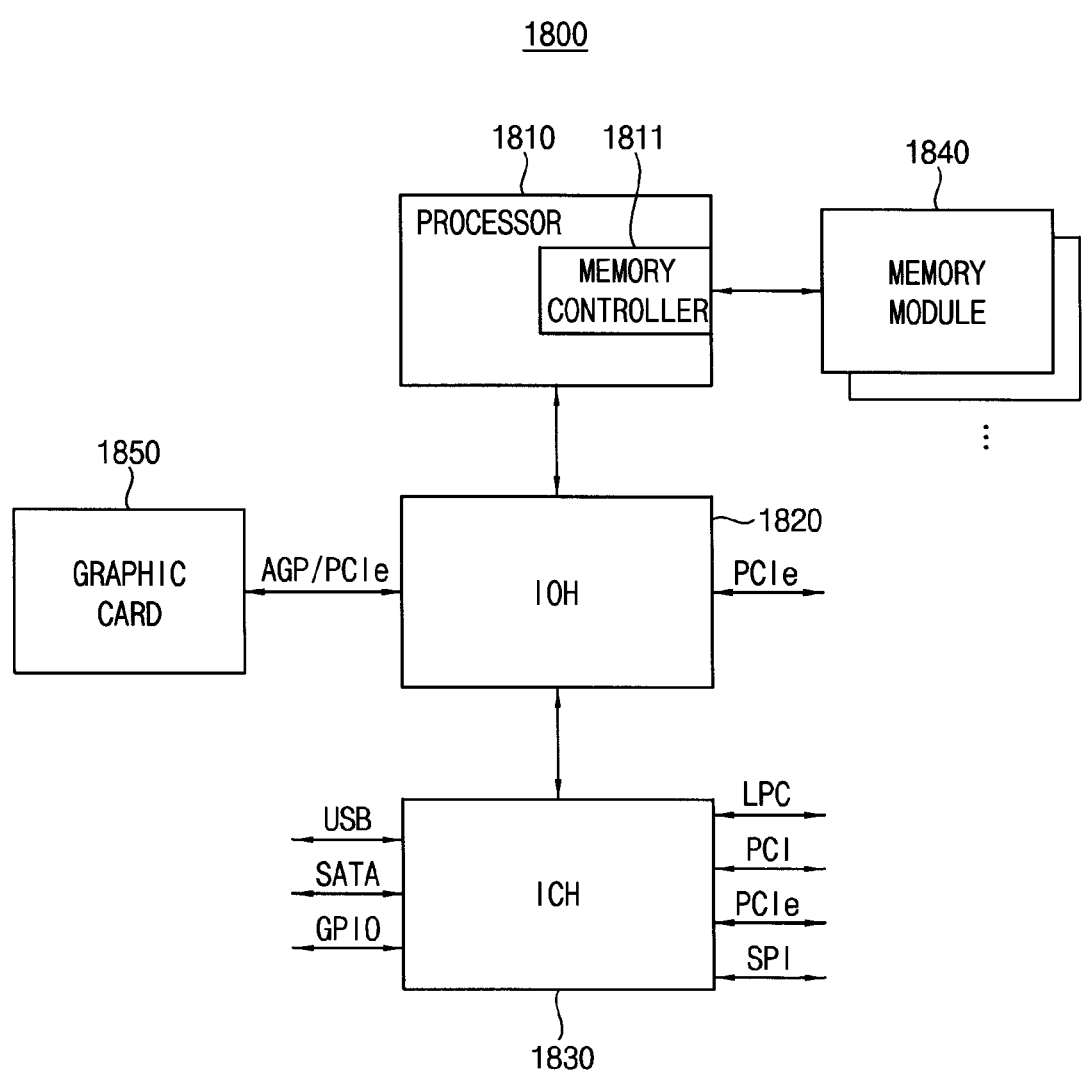
FIG. 19 is a block diagram illustrating a computing system including a memory system according to example embodiments.

FIG. 19 is a block diagram illustrating a computing system including a memory system according to example embodiments.

Referring to FIG. 19, a computing system 1800 includes a processor 1810, an input/output hub (IOH) 1820, an input/output controller hub (ICH) 1830, at least one memory module 1840 and a graphics card 1850. In some embodiments, the computing system 1800 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1810 may perform various computing functions, such as executing specific software for performing specific calculations or tasks. For example, the processor 1810 may be a microprocessor, a central process unit (CPU), a digital signal processor, or the like. In some embodiments, the processor 1810 may include a single core or multiple cores. For example, the processor 1810 may be a multi-core processor, such as a dual-core processor, a quad-core processor, a hexa-core processor, etc. In some embodiments, the computing system 1800 may include a plurality of processors. The processor 1810 may include an internal or external cache memory.

The processor 1810 may include a memory controller 1811 for controlling operations of the memory module 1840. The memory controller 1811 included in the processor 1810 may be referred to as an integrated memory controller (IMC). A memory interface between the memory controller 1811 and the memory module 1840 may be implemented with a single channel including a plurality of signal lines, or may bay be implemented with multiple channels. At least one memory module 1840 may be coupled to each channel. In some embodiments, the memory controller 1811 may be located inside the input/output hub 1820, which may be referred to as memory controller hub (MCH).

The input/output hub 1820 may manage data transfer between a processor 1810 and devices, such as the graphics card 1850. The input/output hub 1820 may be coupled to the processor 1810 via various interfaces. For example, the interface between the processor 1810 and the input/output hub 1820 may be a front side bus (FSB), a system bus, a Hyper-Transport, a lightning data transport (LDT), a QuickPath interconnect (QPI), a common system interface (CSI), etc. In some embodiments, the computing system 1800 may include a plurality of input/output hubs. The input/output hub 1820 may provide various interfaces with the devices. For example, the input/output hub 1820 may provide an accelerated graphics port (AGP) interface, a peripheral component interface-express (PCIe), a communications streaming architecture (CSA) interface, etc.

The graphics card 1850 may be coupled to the input/output hub 1820 via AGP or PCIe. The graphics card 1850 may control a display device (not shown) for displaying an image. The graphics card 1850 may include an internal processor for processing image data and an internal memory device. In some embodiments, the input/output hub 1820 may include an internal graphics device along with or instead of the graphics card 1850 outside the graphics card 1850. The graphics device included in the input/output hub 1820 may be referred to as integrated graphics. Further, the input/output hub 1820 including the internal memory controller and the internal graphics device may be referred to as a graphics and memory controller hub (GMCH).

The input/output controller hub 1830 may perform data buffering and interface arbitration to efficiently operate various system interfaces. The input/output controller hub 1830 may be coupled to the input/output hub 1820 via an internal bus, such as a direct media interface (DMI), a hub interface, an enterprise Southbridge interface (ESI), PCIe, etc. The input/output controller hub 1830 may provide various interfaces with peripheral devices. For example, the input/output controller hub 1830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1810, the input/output hub 1820 and the input/output controller hub 1830 may be implemented as separate chipsets or separate integrated circuits. In other embodiments, at least two of the processor 1810, the input/output hub 1820 and the input/output controller hub 1830 may be implemented as a single chipset.

In accordance with the example embodiments, the frequency of the internal clock signals may be reduced to overcome the operational limits of high-frequency system even though the frequency of the system clock signal increases. Also the power consumption for processing the command may be reduced by detecting the reception timing of the command to selectively activate one of the internal clock signals.

The present inventive concept may be applied to systems such as a memory card, a solid state drive (SSD), a mobile phone, a smart phone, a personal digital assistant (PDA), a portable multimedia player (PMP), a digital camera, a music player, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A command processing circuit comprising:
 a clock divider configured to generate a plurality of divided clock signals based on an external clock signal having a first frequency, the plurality of divided clock signals having a second frequency lower than the first frequency, each of the plurality of divided clock signals having a phase that is different from phases of the remaining divided clock signals;
 a clock controller configured to generate an operating clock signal based on a command signal and the plurality of divided clock signals, the command signal being transferred in synchronization with the external clock signal, the operating clock signal having the second frequency and a phase corresponding to reception timing of the command signal; and
 a command decoder configured to decode the command signal in synchronization with the operating clock signal.

2. The command processing circuit of claim 1, wherein the clock controller is configured to activate one divided clock signal having the phase corresponding to the reception timing of the command signal among the plurality of divided clock signals, and
 the clock controller is configured to provide the one activated divided clock signal as the operating clock signal.

3. The command processing circuit of claim 1, wherein the clock controller is configured to detect the reception timing of the command signal based on a chip selection signal.

4. The command processing circuit of claim 1, wherein the clock controller includes:
 a timing detector configured to generate a plurality of clock enable signals by comparing the phases of the plurality of divided clock signals with a phase of the command signal, and configured to activate one clock enable signal corresponding to the reception timing of the command signal among the plurality of clock enable signals; and
 a clock output circuit configured to provide the operating clock signal based on the plurality of divided clock signals and the plurality of clock enable signals.

5. The command processing circuit of claim 4, wherein the clock output circuit includes a plurality of clock buffers configured to buffer the plurality of divided clock signals and configured to output a plurality of internal clock signals having the second frequency, each of the plurality of internal clock signals having a phase that is different from phases of the remaining internal clock signals.

6. The command processing circuit of claim 5, wherein one internal clock signal among the plurality of internal clock signals, which is output from the clock buffer receiving the one activated clock enable signal, is activated,
 the one activated internal clock signal is provided as the operating clock signal, and
 the remaining internal clock signals other than the one activated internal clock signal are deactivated.

7. The command processing circuit of claim 6, wherein the command decoder includes a plurality of decoding units coupled to outputs of the clock buffers, and
 each of the plurality of decoding units is configured to receive a corresponding internal clock signal among the plurality of internal clock signals.

8. The command processing circuit of claim 7, wherein one decoding unit among the plurality of decoding units, which receives the operating clock signal, is enabled to decode the command signal, and
 the remaining decoding units are disabled.

9. The command processing circuit of claim 4, wherein the clock output circuit includes a phase splitter configured to receive one divided clock signal among the plurality of divided clock signals and configured to adjust a phase of the one received divided clock signal to output a plurality of internal clock signals having the second frequency, each of the plurality of internal clock signals having a phase that is different from phases of the remaining internal clock signals.

10. The command processing circuit of claim 9, wherein one internal clock signal among the plurality of internal clock signals, which corresponds to the one activated clock enable signal, is activated,
 the one activated internal clock signal is provided as the operating clock signal, and
 the remaining internal clock signals other than the one activated internal clock signal are deactivated.

11. The command processing circuit of claim 10, wherein the command decoder includes a plurality of decoding units coupled to outputs of the phase splitter, and each of the plurality of decoding units is configured to receive a corresponding clock signal among the plurality of internal clock signals.

12. The command processing circuit of claim 11, wherein one decoding unit among the plurality of decoding units, which receives the operating clock signal, is enabled to decode the command signal, and
 the remaining decoding units are disabled.

13. The command processing circuit of claim 9, wherein the phase splitter is disposed closer to the command decoder than to the clock divider.

14. The command processing circuit of claim 4, wherein the clock output circuit includes a multiplexer configured to select one divided clock signal among the plurality of divided clock signals in response to the plurality of clock enable signals, and
 the multiplexer is configured to provide the one selected divided clock signal as the operating clock signal.

15. The command processing circuit of claim 14, wherein the command decoder includes a decoding unit coupled to an output of the multiplexer, and the decoding unit is configured to receive the operating clock signal and decode the command signal.

16. The command processing circuit of claim 4, wherein the timing detector includes:

a first flip-flop configured to latch a chip selection signal in response to a first divided clock signal among the plurality of divided clock signals;

a second flip-flop configured to latch the chip selection signal in response to a second divided clock signal among the plurality of divided clock signals;

a first AND logic gate configured to perform AND logic operation on an inversion output of the first flip-flop, the chip selection signal and the second divided clock signal;

a second AND logic gate configured to perform AND logic operation on an inversion output of the second flip-flop, the chip selection signal and the first divided clock signal;

a first OR logic gate configured to perform OR logic operation on an output of the first flip-flop, an output of the first AND logic gate and a first latency alignment signal, and configured to output a first clock enable signal among the plurality of clock enable signals; and a second OR logic gate configured to perform OR logic operation on an output of the second flip-flop, an output of the second AND logic gate and a second latency alignment signal, and configured to output a second clock enable signal among the plurality of clock enable signals.

17. The command processing circuit of claim 16, wherein the timing detector is configured to deactivate the first clock enable signal in response to the first latency alignment signal and configured to deactivate the second clock enable signal in response to the second latency alignment signal.

18. The command processing circuit of claim 17, wherein the command decoder is configured to generate the first latency alignment signal and the second latency alignment signal based on values stored in a mode register set.

19. A memory device comprising:

a memory core configured to operate in response to a control signal;

a command processing circuit configured to decode a command signal from an external device; and a control circuit configured to generate the control signal based on an output of the command processing circuit, wherein the command processing circuit includes:

a clock divider configured to generate a plurality of divided clock signals based on an external clock signal having a first frequency, the plurality of divided clock signals having a second frequency lower than the first frequency, each of the plurality of divided clock signals having a phase that is different from phases of the remaining divided clock signals;

a clock controller configured to generate an operating clock signal based on the command signal and the plurality of divided clock signals, the command signal being transferred in synchronization with the external clock signal, the operating clock signal having the second frequency and a phase corresponding to reception timing of the command signal; and a command decoder configured to decode the command signal in synchronization with the operating clock signal.

20. A mobile device comprising:

a processor;

a storage device;

a display device;

a power supply;

an image sensor; and a memory system including:

a memory controller configured to transfer a command signal in response to a system clock signal;

a memory core configured to operate in response to a control signal;

a command processing circuit configured to decode the command signal from the memory controller; and a control circuit configured to generate the control signal based on an output of the command processing circuit, wherein the command processing circuit comprises:

a clock divider configured to generate a plurality of divided clock signals based on the system clock signal having a first frequency, the plurality of divided clock signals having a second frequency lower than the first frequency, each of the plurality of divided clock signals having a phase that is different from phases of the remaining divided clock signals;

a clock controller configured to generate an operating clock signal based on the command signal and the plurality of divided clock signals, the operating clock signal having the second frequency and a phase corresponding to reception timing of the command signal; and a command decoder configured to decode the command signal in synchronization with the operating clock signal.

* * * * *